United States Patent [19]

Nagasaki et al.

[11] Patent Number: 5,055,930
[45] Date of Patent: Oct. 8, 1991

[54] IMAGE SENSING AND RECORDING DEVICE HAVING A MULTILAYER ANALOG MEMORY STACKED ON AN IMAGE SENSING ARRAY

[75] Inventors: Tatsuo Nagasaki, Yokohama; Hidetoshi Yamada, Tokyo, both of Japan

[73] Assignee: Olympus Optical Co., Ltd., Tokyo, Japan

[21] Appl. No.: 579,784

[22] Filed: Sep. 7, 1990

[30] Foreign Application Priority Data

Sep. 13, 1989 [JP] Japan .................................. 1-237472

[51] Int. Cl.⁵ .......................... H04N 5/30; H04N 3/14; H04N 5/335
[52] U.S. Cl. ............................... 358/213.11; 358/209; 358/909; 358/213.23; 358/213.27; 357/24 LR
[58] Field of Search ....................... 358/213.11, 213.13, 358/213.33, 909, 213.31, 213.25, 213.27, 213.29, 212, 209; 352/24 LR, 30 I; 250/208.1

[56] References Cited

U.S. PATENT DOCUMENTS

| 4,245,164 | 1/1981 | Funahashi ........................ 307/221 D |
| 4,489,351 | 12/1984 | D'Alayer De Costemore D'Arc ................................ 358/213 |
| 4,592,029 | 5/1986 | Altmann et al. ........................ 367/7 |
| 4,651,001 | 3/1987 | Harada et al. ........................ 250/330 |
| 4,675,535 | 6/1987 | Tsunekawa et al. ............. 250/208.1 |
| 4,717,945 | 1/1988 | Yusa et al. ........................ 357/24 LR |
| 4,758,883 | 7/1988 | Kawahara et al. .................... 358/44 |
| 4,837,628 | 6/1989 | Sasaki ................................ 358/209 |
| 4,851,887 | 7/1989 | Aagiwara ........................ 357/24 LR |
| 4,963,980 | 10/1990 | Suga et al. ............................ 358/209 |

FOREIGN PATENT DOCUMENTS 0323194 7/1989 European Pat. Off. .
DE3705146-A1 8/1987 Fed. Rep. of Germany .
DE4006599-A1 6/1990 Fed. Rep. of Germany .
56-43884 4/1981 Japan .

OTHER PUBLICATIONS

Collet, M.; Vergleich von Halbleiterbildauf-Nehmern: Interline-, XY- und Frame-Transfer-Konzept. In: Fernseh- Und Kino-Technik, 40 Jg., Nr. 10, 1986, 463–467.

Primary Examiner—James J. Groody
Assistant Examiner—Safet Metjahic
Attorney, Agent, or Firm—Frishauf, Holtz, Goodman & Woodward

[57] ABSTRACT

An image sensing and recording device includes a light-receiving element array, an analog memory, and a transfer section which are integrally formed. The array has an image sensing surface on which a plurality of light-receiving elements are two-dimensionally arranged and generates signal charges by photoelectrically converting light images incident on the surface in units of the elements. The memory has a plurality of storage regions having a multilayer structure stacked on the array. The storage regions transfer the signal charges generated by the elements of the array in a stacked direction thereof and sequentially storing the signal charges. The transfer section is stacked to sandwich the memory between the transfer section and the array and is designed to read out the signal charges, which are sequentially stored in the memory, as time-serial image signals. A dark box incorporates the device. An optical lens is arranged in the dark box so as to form an object image on the surface of the device. A controller is arranged in the dark box so as to control generation of signal charges by the array of the device and to control transfer/storage of signal charges by the memory.

24 Claims, 9 Drawing Sheets

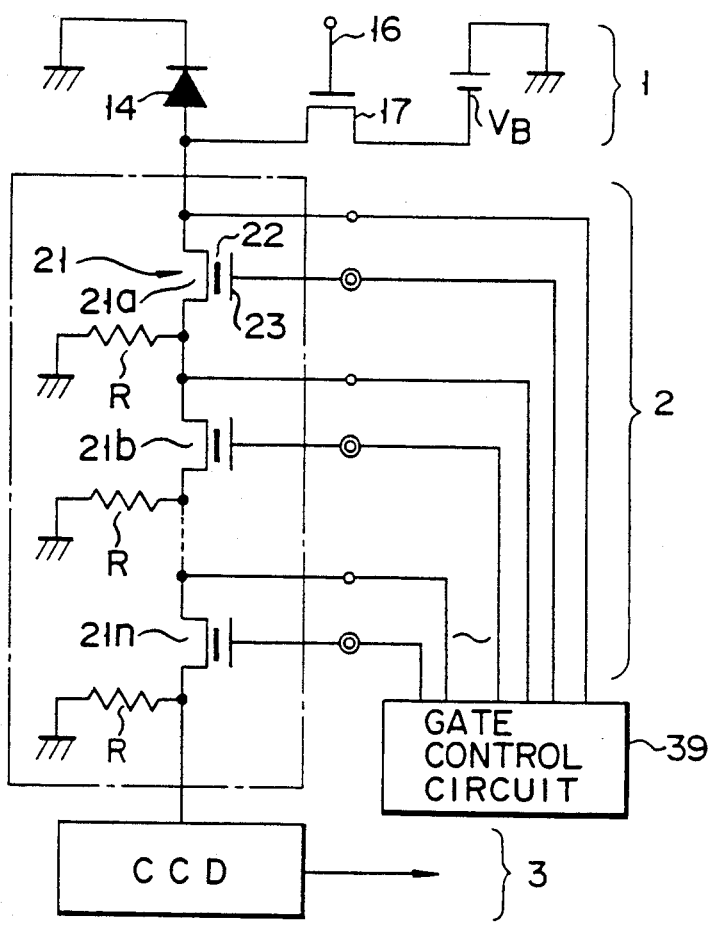
F I G. 3A
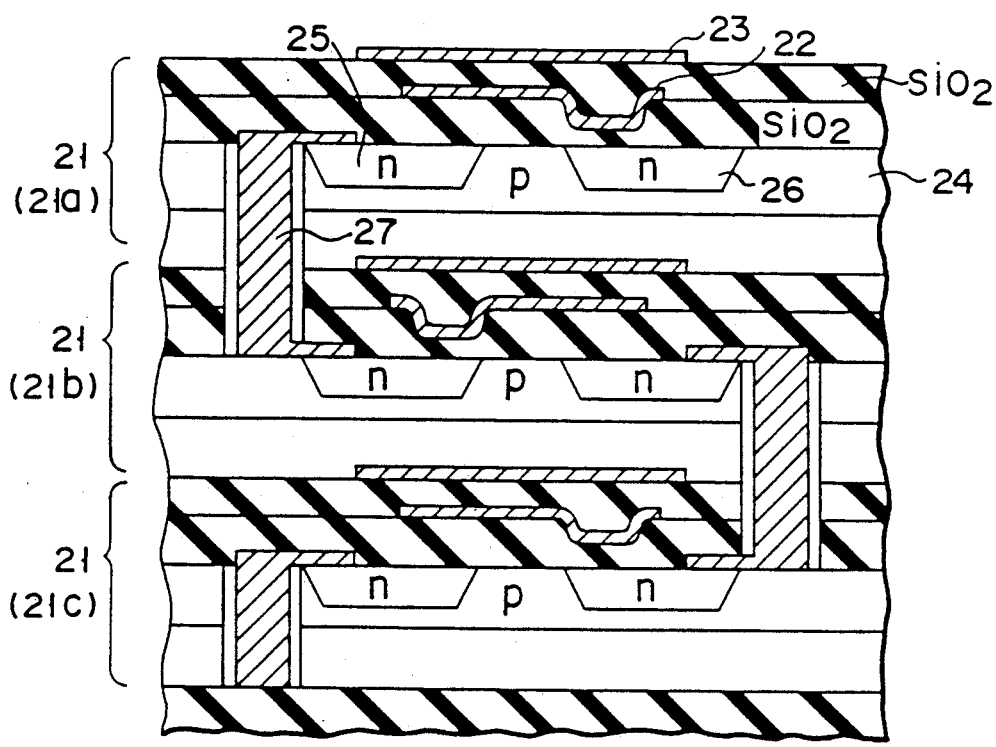
F I G. 4

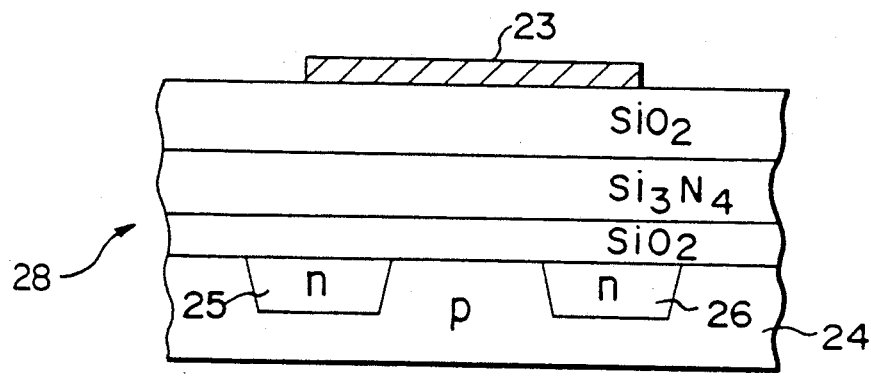
F I G. 5
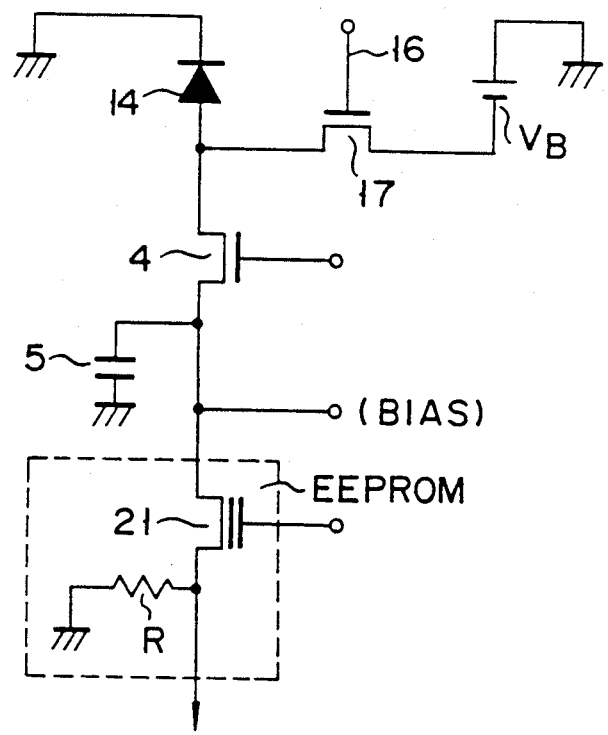
F I G. 6

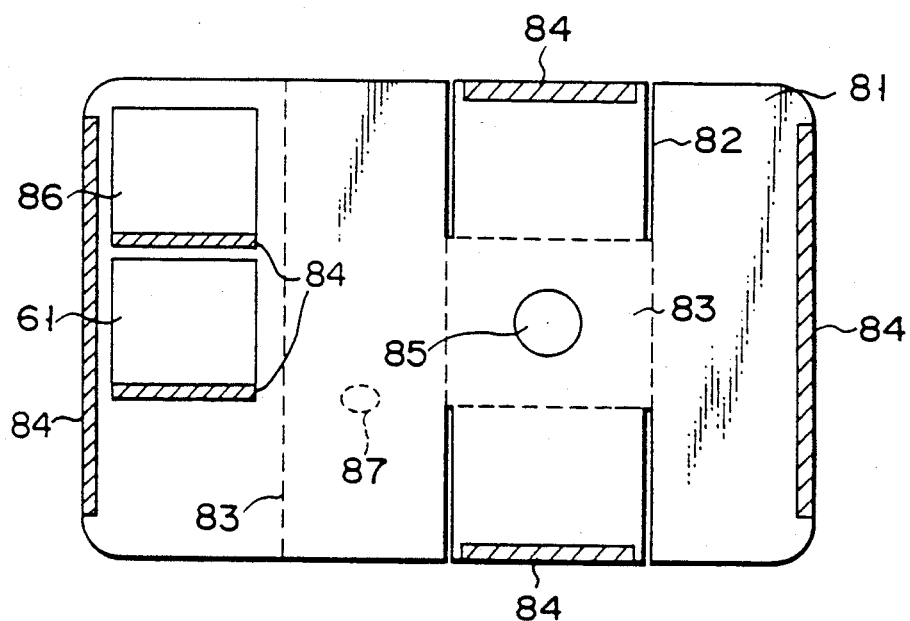
F I G. 10A
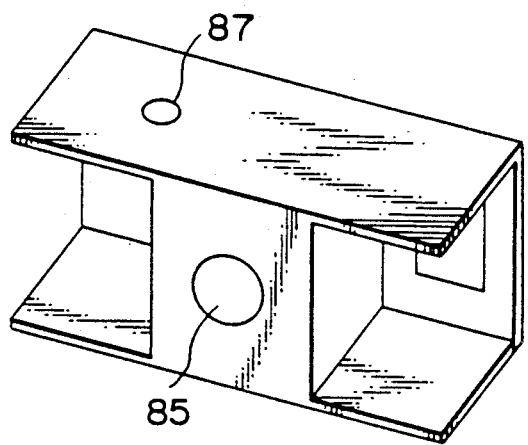
F I G. 10B

IMAGE SENSING AND RECORDING DEVICE HAVING A MULTILAYER ANALOG MEMORY STACKED ON AN IMAGE SENSING ARRAY

BACKGROUND OF THE INVENTION

1. Field of the Invention

The present invention generally relates to an image sensing and recording device and an electronic still camera using the same and, more particularly, to an image sensing and recording device suitably used in a portable compact-type electronic still camera and an electronic still camera constituted by the image sensing and recording device.

2. Description of the Related Art

In recent years, various types of electronic still cameras have been developed. An electronic still camera of this type is designed to electronically sense an object image, record the resultant electronic still image signal in a magnetic recording medium such as a floppy disk, and provide the signal for image reproduction by means of a television receiver or the like.

As disclosed in Published Unexamined Japanese Patent Application No. 56-43884, an electronic still camera of this type comprises an optical lens, a solid-state image sensing device such as a CCD (charge coupled device) for photoelectrically converting an object image formed by the optical lens into signal charges corresponding to incident light in units of pixels, and a signal processing circuit for reading out the electronic still image signals electronically sensed by the solid-state image sensing device as time-serial signals and sequentially recording the signals in a predetermined recording medium such as a floppy disk or a memory card in units of images. Note that the electronic still camera may incorporate an image signal processor for performing color separation processing and the like of electronic still image signals to be recorded in a predetermined recording medium. In addition, the above-mentioned recording medium is generally designed to be detachably mounted on an electronic still camera main body so that after the recording medium is mounted on the electronic still camera main body to record electronic still image signals, the recording medium is detached from the electronic still camera main body and is mounted on a predetermined image reproducing unit so as to perform reproduction of still images upon reading of the electronic still image signals recorded in the recording medium.

According to the electronic still camera having such a system arrangement, a relatively long period of time is inevitably required to electronic image sensing input of an object image by means of the solid-state image sensing device and record electronic still image signals obtained by this image sensing in a predetermined recording medium. That is, when electronic still images electronically sensed by the solid-state image sensing device are to be recorded in a predetermined medium, the image signals are read out from the solid-state image sensing device as time-serial signals, and they must be recorded upon addition of sync signals or the like. For this reason, it time-serially takes much time to read and record electronic still image signals.

Furthermore, in order to perform the above-described image sensing and recording operation of electronic still image signals, complicated operation control such as read control of time-serial electronic still image signals by scanning performed by a solid-state image sensing device. This inevitably requires a control circuit for such control. For this reason, the arrangement itself of the electronic still camera is considerably complicated. This inevitably increases the cost of the camera.

Moreover, since a predetermined recording medium must be designed to be detachable or must be incorporated in the electronic still camera main body, the hardware arrangement is inevitably complicated, resulting in a large increase in cost of the came.

SUMMARY OF THE INVENTION

It is, therefore, an object of the present invention to provide a new and improved image sensing and recording device which can contribute to a decrease in cost of an image sensing and recording device main body such as an electronic still camera and to an improvement in operability.

It is another object of the present invention to provide a highly practicable electronic still camera which can simplify its hardware arrangement and decrease the cost by using the above-mentioned image sensing and recording device, and can improve the operability by simplifying its internal processing operation and processing control.

According to one aspect of the present invention, there is provided an image sensing and recording device comprising:

a light-receiving element array section, having an image sensing surface on which a plurality of light-receiving elements are two-dimensionally arranged, for generating signal charges by photoelectrically converting light images incident on the image sensing surface in unit of the plurality of light-receiving elements;

an analog memory section having a plurality of storage regions stacked on the light-receiving element array section, the plurality of storage regions transferring the signal charges generated by the plurality of light-receiving elements of the light-receiving element array section in a stacked direction thereof and sequentially storing the signal charges; and a transfer section, stacked to sandwich the analog memory section between the transfer section and the light-receiving element array section, for reading out the signal charges, which are sequentially stored in the analog memory section, as time-serial image signals.

According to another aspect of the present invention, there is provided an electronic still camera comprising:

an image sensing and recording device comprising:

a) a light-receiving element array section, having an image sensing surface on which a plurality of light-receiving elements are two-dimensionally arranged, for generating signal charges by photoelectrically converting light images incident on the image sensing surface i units of the plurality of light-receiving elements, b) an analog memory section having a plurality of storage regions in a multilayer structure stacked on the light-receiving element array section, the plurality of storage regions transferring the signal charges generated by the plurality of light-receiving elements of the light-receiving element array section in a stacked direction thereof and sequentially storing the signal charges, and c) a transfer section, stacked to sandwich the analog memory section between the transfer section and the light-receiving element array section, for reading out the signal charges, which are sequentially stored in the analog memory section, as time-serial image signals;

a dark box member incorporating the image sensing and recording device;

an optical lens, arranged in the dark box member, for forming an object image on the image sensing surface of the image sensing and recording device; and control means, arranged in the dark box member, for controlling generation of signal charges by the light-receiving element array section of the image sensing and recording device and controlling transfer/storage of signal charges by the analog memory section.

According to still another aspect of the present invention, there is provided an electronic still camera wherein a card-like base member which can be assembled into a box to constitute the dark box member upon bending is realized as a base member having a structure in which, e.g., slit portions which can be separated upon assembly and folding portion which define portions to be bent are formed in advance, and an image sensing and recording device, an optical lens for forming an object image o the light-receiving surface of the image sensing and recording device, a power source section for supplying driving power to the image sensing and recording device, and a switching section for controlling image sensing and recording of an object image to be performed by the image sensing and recording device are arranged on the base member.

According to the image sensing and recording device having the above-described arrangement, electronic still images sensed by the light-receiving element array section are parallelly transferred and sequentially stored in the analog memory section at a high speed without any signal processing. Thereafter, the electronic still images are sequentially read out from the analog memory section and can be recorded as image signals upon predetermined image signal processing. That is, an electronic still image sensed by the light-receiving element array section can be read out upon each photographing operation and can be temporarily and sequentially stored in the analog memory section at a high speed without any predetermined image signal processing. Thereafter, the electronic still images stored in the analog memory section are sequentially read out and can be processed according to predetermined image signal processing during a period allowing sufficient time for such processing.

As a result, processing, e.g., from electronic image sensing of an object image by means of the light-receiving element array section to recording of the obtained image signal need not be performed at a high speed, and a sufficient time can be spared for a series of operations.

In addition, since the image sensing and recording device having such an element structure incorporates the analog memory section for storing a plurality of electronic still images, the basic functions of an electronic still camera can be realized by a very compact arrangement. This allows great simplification of the arrangement. More specifically, an electronic sill camera can be formed by simply incorporating an image sensing and recording device, an optical lens for forming an object image on the image sensing surface of the image sensing and recording device, and a means for driving the image sensing and recording device in a predetermined dark box member. Electronic still images sensed by such an electronic still camera are read out from the image sensing and recording device. Predetermined image signal processing of the readout signals is performed to be used for image signal recording or image reproduction. With this arrangement, a new and improved electronic still camera system can be formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention, in which:

FIG. 3A is an equivalent electric circuit diagram of the image sensing and recording device (FIG. 1) per pixel;

FIG. 4 is a sectional view showing an element structure of each EEPROM cell constituting an analog memory section of the image sensing and recording device in FIG. 1;

FIG. 5 is a sectional view showing a case wherein the analog memory section in FIG. 4 is realized by an NMOS structure;

FIG. 6 is a circuit diagram showing an arrangement of a light-receiving element section having a shutter function;

FIGS. 10A and 10B are views showing an electronic still camera having a card-like structure to be assembled.

DETAILED DESCRIPTION OF THE PREFERRED EMBODIMENTS

Figure 1:
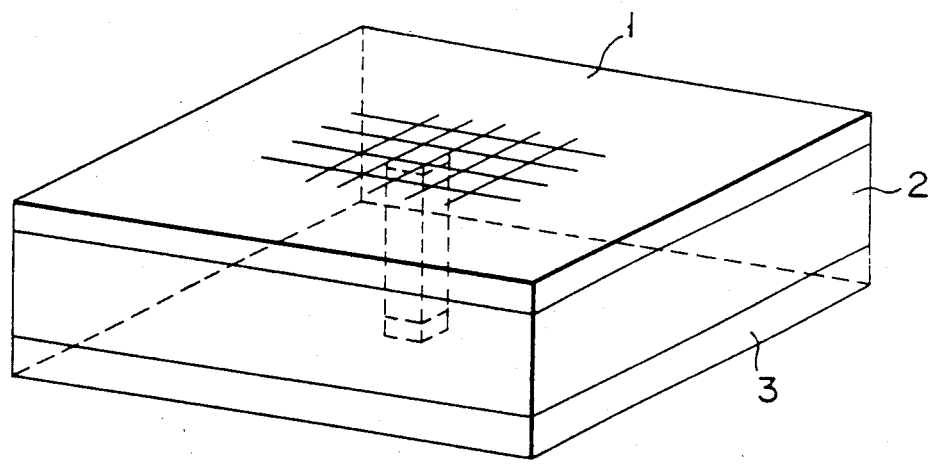
FIG. 1 is a schematic view showing an arrangement of an image sensing and recording device for an electronic still camera according to the first embodiment of the present invention.

Reference will now be made in detail to the presently preferred embodiments of the invention as illustrated in the accompanying drawings, in which like reference characters designate like or corresponding parts throughout the several drawings.

An embodiment of the present invention will be described below with reference to the accompanying drawings.

FIG. 1 shows a schematic arrangement of an image sensing and recording device according to an embodiment of the present invention. Referring to FIG. 1, reference numeral 1 denotes a light-receiving element array section consisting of a plurality of light-receiving elements two-dimensionally arranged on a plane; 2, an analog memory section, having a multilayer structure, for sequentially storing electronic still images sensed by the light-receiving element array section 1 and transferred in parallel therefrom; and 3, a transfer section for reading out and outputting electronic still images transferred from the analog memory section 2 as time-serial image signals. The light-receiving element array section 1, the analog memory section 2, and the transfer section 3 are realized as one semiconductor device having an element structure stacked/integrated on a semiconductor substrate (to be described later).

More specifically, this image sensing and recording device is characterized in that the analog memory section 2 having the multilayer structure, in which a plurality of layers as two-dimensional multistage analog memories constituted by, e.g., EEPROMs (electrically erasable programmable read only memories) having signal charge storage portions respectively corresponding to the plurality of light-receiving elements, is arranged between the light-receiving element array section 1 and the transfer section 3 of a solid-state image sensing device having a conventional arrangement, i.e., an arrangement constituted by the light-receiving element array section 1 consisting of the plurality of two-dimensionally arranged light-receiving elements, and the transfer section 3, constituted by a CCD or a MOS (metal oxide semiconductor) switch array, for reading electronic still images electronically sensed by the light-receiving element array section 1 as time-serial image signals.

Figure 2:
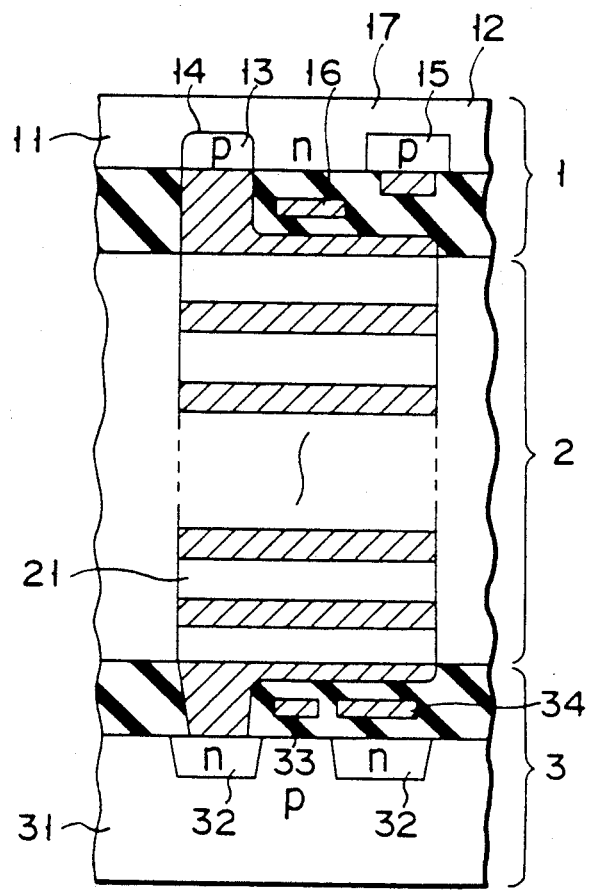
FIG. 2 is an sectional view showing a sectional element structure of the image sensing and recording device (FIG. 1) per pixel.

FIG. 2 shows such an element structure of the image sensing and recording device and, more specifically, a sectional structure per pixel. FIG. 3A shows an electrically equivalent circuit of the structure. Referring to FIG. 2, a CCD channel 32 consisting of an n-type impurity layer is formed on, e.g., a p-type semiconductor substrate 31. A transfer gate electrode 33 and a CCD electrode 34 are then embedded in an insulating layer on the CCD channel 32, thus forming the transfer section (CCD) 3.

EEPROM cells 21 are stacked on each CCD channel (pixel) of the transfer section 3 to form a multilayer structure, thus forming the analog memory section 2. In addition, a light-receiving element 11 as one pixel of the light-receiving element array section 1 is stacked on the resultant structure to constitute an image sensing and recording device.

The light-receiving element 11 comprises a photodiode 14 formed between an n-type layer 12 and a p-type layer 13 embedded in the n-type layer 12, and a reset transistor 17 constituted by the p-type layer 13, the n-type layer 12, a p-type layer 15, and a gate electrode 16 embedded in an insulating layer.

The light-receiving element 11 having the above-described arrangement is driven upon reception of a predetermined bias voltage $V_B$, as shown in FIG. 3A and generates a charge corresponding to light incident on the photodiode 14 by photoelectric conversion. The charge generated by photoelectric conversion is eliminated upon reset control by means of the gate electrode 16 as needed.

The EEPROM cells 21 constituting the abovementioned analog memory section 2 are, for example, sequentially stacked in the vertical direction, as shown in FIG. 4. Each EEPROM cell 21 is constituted as a memory cell basically including a control gate electrode 23 having a floating gate 22 between itself and an adjacent control gate electrode 23, n-type source and drain regions 25 and 26 embedded in a p-type layer 24, and a load resistor R. The EEPROM cells 21 are sequentially connected to each other through wiring interlayer electrodes 27 in the vertical direction. The EEPROM cells 21 are operated by bias voltages applied to the respective bias electrodes of the EEPROM cells 21, transfer/input charges generated by the light-receiving element upon reception of transfer control pulses applied to the respective control electrodes 23, hold the signal therein, and transfer/output the held signal charges downward.

A gate control circuit 39 shown in FIG. 3A is designed to sequentially apply bias voltages to the plurality of EEPROM cells 21 ($21a, 21b, \ldots 21n$) having the multilayer structure and to sequentially transfer the signal charges supplied from the light-receiving element 11 in the vertical direction (the stacked direction of multilayer) by applying transfer pulses to the respective control gates 23.

Figure 3B:
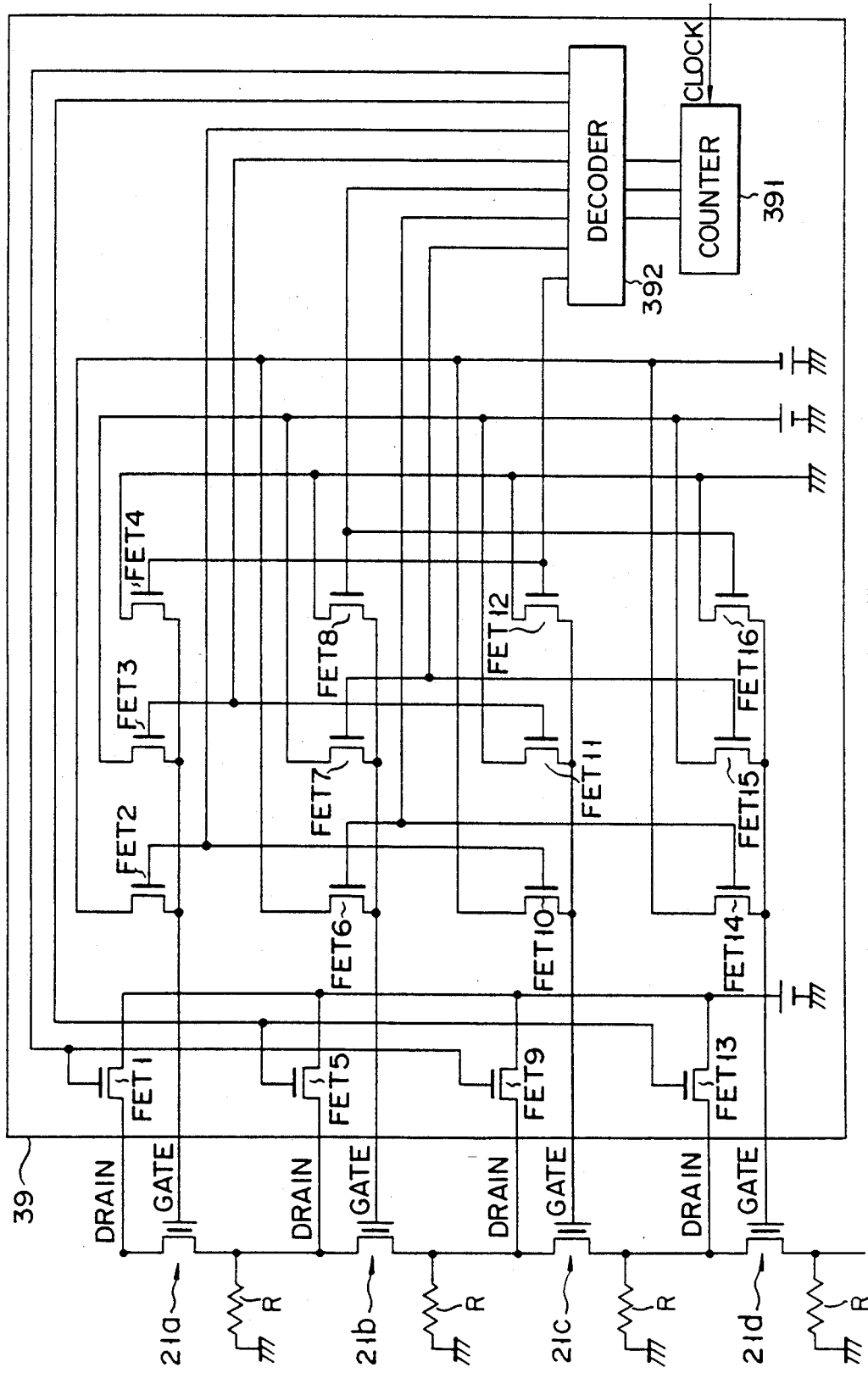
FIG. 3B is a block diagram showing a gate control circuit of FIG. 3A.
Figure 3C:
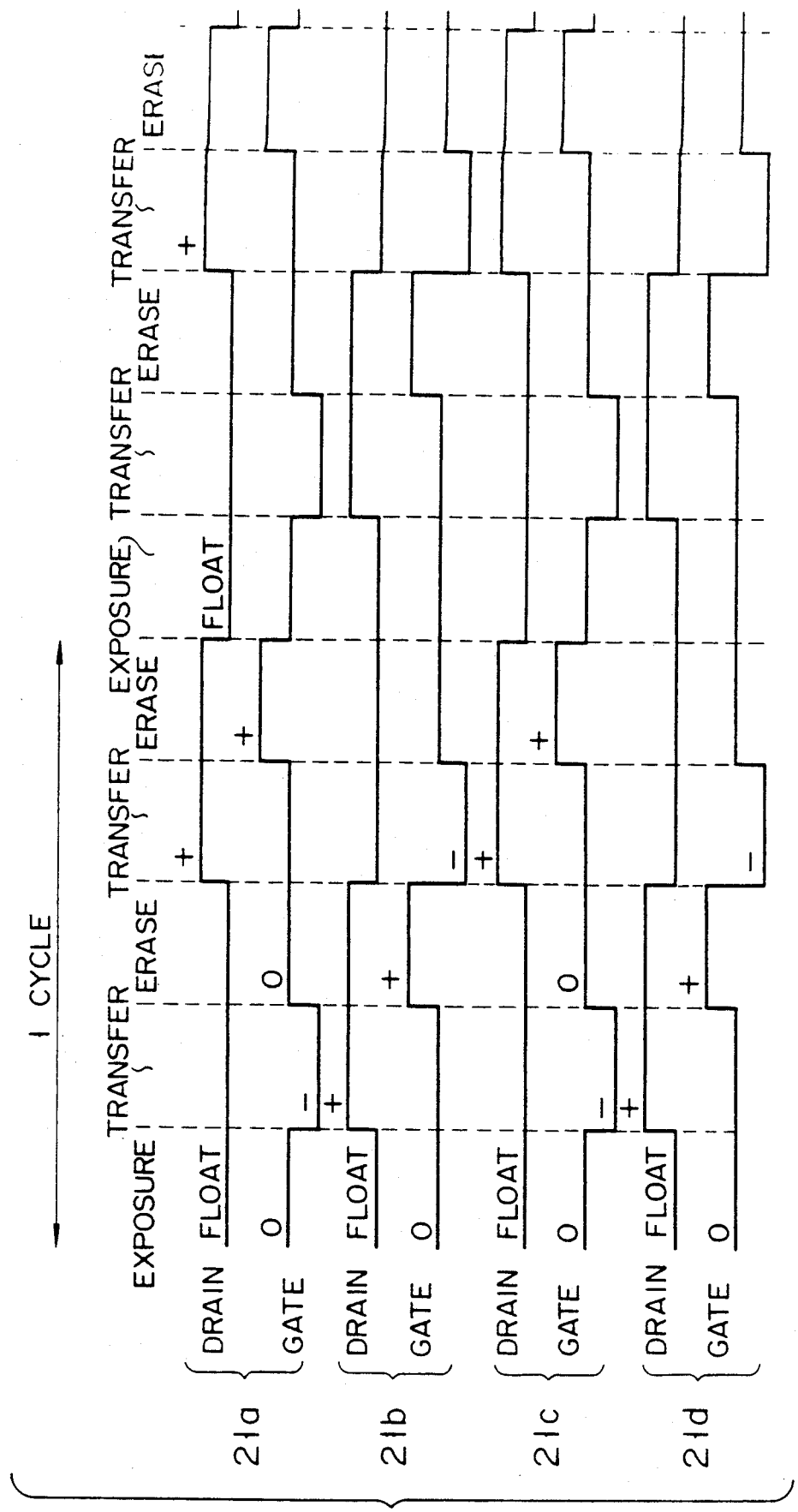
FIG. 3C is a timing chart for explaining the operation of the gate control circuit shown in FIG. 3B.

As shown in FIG. 3B, the gate control circuit 39 includes a counter 391 for counting clock signals, a decoder 392 for decoding outputs from the counter 391, and matrix connected field effect transistors FET-1–FET16 for producing gate control signal such as transfer pulses and drain control bias voltage supplying to EEPROM cells 21, in accordance with outputs from the decoder 392. FIG. 3C shows a timing chart for explaining the operation of the gate control circuit 39 to four-stacked. EEPROM cells $21a, 21b, 21c$ and $21d$.

In FIG. 3C, FLOAT represents a floating condition, + represents a positive voltage level, 0 represents a ground potential level, − represents a negative voltage level, and one cycle has an exposure period, a transfer period, an erase period, a transfer period and an erase period, sequentially.

Note that the analog memory section 2 can be constituted by memory cells 28 each having, e.g., an MNOS (metal nitride oxide semiconductor) structure shown in FIG. 5 in place of the EEPROM cells 21 each having such an arrangement.

The memory cells 28 of the MNOS structure each have a source region 26 and a drain region 26 which are n-type layers implanted in a p-type layer 24. Also, three insulating films ($SiO_2$, $Si_3N_4$, $SiO_2$) are formed on layer 24, and a control gate electrode 23 is formed on these insulating layers. These memory cells 28 function as non-volatile memories. The load resistors R for memory cells 28 are formed the same way as for EEPROMs shown in FIG. 4.

The analog memory section 2 having such a vertical structure can be realized by properly using various types of conventional proposed semiconductor techniques. Basically, the analog memory section 2 is to be designed such that analog memory cells are formed to have a multilayer structure, and the respective transfer electrodes are arranged as connecting interlayer electrodes in the vertical direction so as to constitute a three-dimensional element structure. In addition, the number of layers is to be determined in accordance with the specifications of an electronic still camera or a semiconductor manufacturing technique, i.e., in accordance with the number of electronic still images to be recorded.

In the above-described embodiment, a signal charge generated by the photodiode 14 in accordance with incident light is directly transferred to the EEPROM cell 21. The present invention, however, is not limited to this. For example, as shown in FIG. 6, a gate control transistor 4 and a signal charge storage capacitor 5 may be arranged between the photodiode 14 and the EEPROM cell 21 so as to control the storage time when a signal charge generated by the photodiode 14 is stored in the capacitor 5. With this arrangement, the storage time required when a signal charge photoelectrically converted by the photodiode 14 is stored in the capacitor 5 can be controlled upon gate control by means of the transistor 4. Therefore, a so-called electronic shutter function can be provided to the above-described light-receiving element 11.

According to the image sensing and recording device having the above-described arrangement, electronic still images sensed by the light-receiving element array section 1 can be transferred in parallel to the analog memory section 2 in units of pixels, and the corresponding signal charges can be respectively stored/retained by the EEPROM cells 21. After the signal charges of the sensed electronic still images are transferred in parallel to the EEPROM cells 21 and are stored/retained therein, the next object image can be electronically sensed by the light-receiving element array section 1. In this case, the signal charge of an electronic still image already stored in a given EEPROM cell 21 is transferred to the EEPROM cell 21 of the next stage, and the signal charge of a newly sensed electronic still image is transferred to the given EEPROM cell 21, which became empty upon transfer/output of the signal charge, thereby storing/retaining the new signal charge.

A plurality of electronic still images can be sequentially written and retained in the plurality of EEPROM cells 21 constituting the analog memory section 2 in the following manner. An electronic still image signal sensed by the light-receiving element array section 1 is written in the EEPORM cell 21 of the first stage (uppermost stage) of the analog memory section 2, and transfer control is performed to sequentially transfer the electronic still image signal to the EEPROM cells 21 of the subsequent stages.

This image sensing operation and a transfer operation of a sensed electronic still image will be described in detail below with reference to FIG. 3A to 3C and FIG. 6. Electronic image sensing of an object image by means of the light-receiving element array section 1 is started when the photodiode 14 is reset by performing gate control of the reset transistor 17, and its reset gate is closed to start storage of a signal charge corresponding to incident light. This operation corresponds to an opening operation of a so-called shutter (not shown). Thereafter, the charge stored in the photodiode 14 is transferred to the EEPROM cell 21 after the lapse of a predetermined period of time, and electronic exposure is completed to close the shutter. However, in a case wherein the above-mentioned gate control transistor 4 is arranged, an image sensing operation is completed when the signal charge obtained by the photodiode 14 is held in the capacitor 5 upon ON time control of the transistor 4. Such control of the storage time of a signal charge with respect to the capacitor 5 allows a high-speed shutter operation.

Although transfer of a signal charge from the light-receiving element array section 1 to the EEPROM cell 21 normally requires an operation time of several milliseconds, this operation time is very short compared with the time required to read out all the electronic still image signals under the transfer control of the transfer section 3.

That is, writing of a signal charge (electronic still image) in the EEPROM cell 21 is performed by applying a negative voltage to the above-mentioned control gate electrode 23. When the negative voltage is applied to the control gate electrode 23, a tunnel current flows from the floating gate 22 to the drain of the EEPROM cell 21. As a result, the floating gate 22 is charged with a positive voltage. Since the photodiode 14 is connected to the drain, the drain voltage is changed in accordance with the amount of charge generated by the photodiode 14, i.e., the amount of light incident on the photodiode 14. This causes a change in charge amount of the floating gate 22. With this change in charge amount of the floating gate 22, a signal charge corresponding to an exposure amount determined for each pixel is stored (written) in the EEPROM cell 21.

The signal charge (electronic still image) written in the EEPROM cell 21 (21a) of the first stage is basically transferred/written in the EEPROM cell 21 (21b) of the next stage in the following manner. The potential of the control gate 23 of the EEPROM cell 21 (21a) in which the signal charge is stored is set to be 0 V, and a predetermined bias voltage is applied to the node of the EEPROM cells 21 (21a, 21b) of the first and next stages. With this operation, a channel current corresponding to (almost proportional to) the charge amount of the floating gate 22 flows in the EEPROM cell 21 (21a) of the first stage, and a voltage proportional to the channel current is generated in the load resistor R. The voltage generated in the load resistor R, which is proportional to the channel current, corresponds to the signal charge (voltage) generated by the photodiode 14 in accordance with the amount of incident light. Therefore, if the EEPROM cell 21 (21b) of the next stage is driven in this state in the above-described manner, the signal charge is written in the EEPROM cell 21 (21b) of the next stage. That is, transfer of the signal charge between the EEPROM cells 21 (21a, 21b) is performed.

If a positive voltage is subsequently applied to the control gate electrode 23 of the EEPROM cell 21 (21a) which has completed transfer of the signal charge, the charge stored in the floating gate 22 can be supplied to the drain. With this operation, the signal charge is eliminated, and a preparation operation for writing the next signal charge can be completed.

Assume that electronic still images which are sequentially sensed and input include an image which need not be recorded/retained. In this case, the signal charge of the corresponding EEPROM cell 21 is eliminated without transferring the corresponding still image signal to the EEPROM cell 21 of the next stage. Subsequently, a transfer/write operation of a new signal charge is performed in the above-described manner to only the EEPROM cell 21 from which the signal charge is eliminated while the signal charges (electronic still images) stored in the EEPROM cells 21 of the subsequent stages are retained as they are. According to such control, only signal charges of unnecessary electronic still images can be eliminated to allow only necessary electronic still images to be sequentially recorded/retained in the analog memory section 2 having a limited capacity.

If such an image sensing and recording device is used for an electronic still camera, a plurality of electronic still images electronically sensed by the light-receiving element array section 1 can be stored/retained in the analog memory section 2 without reading them out from the transfer section 3 one by one. Subsequently, the above-mentioned electronic still images can be read out from the analog memory section 2 through the transfer section 3, as needed, and can be used for image reproduction or the like. Therefore, an electronic still camera main body can be very easily formed by only basic constituent elements.

Figure 7:
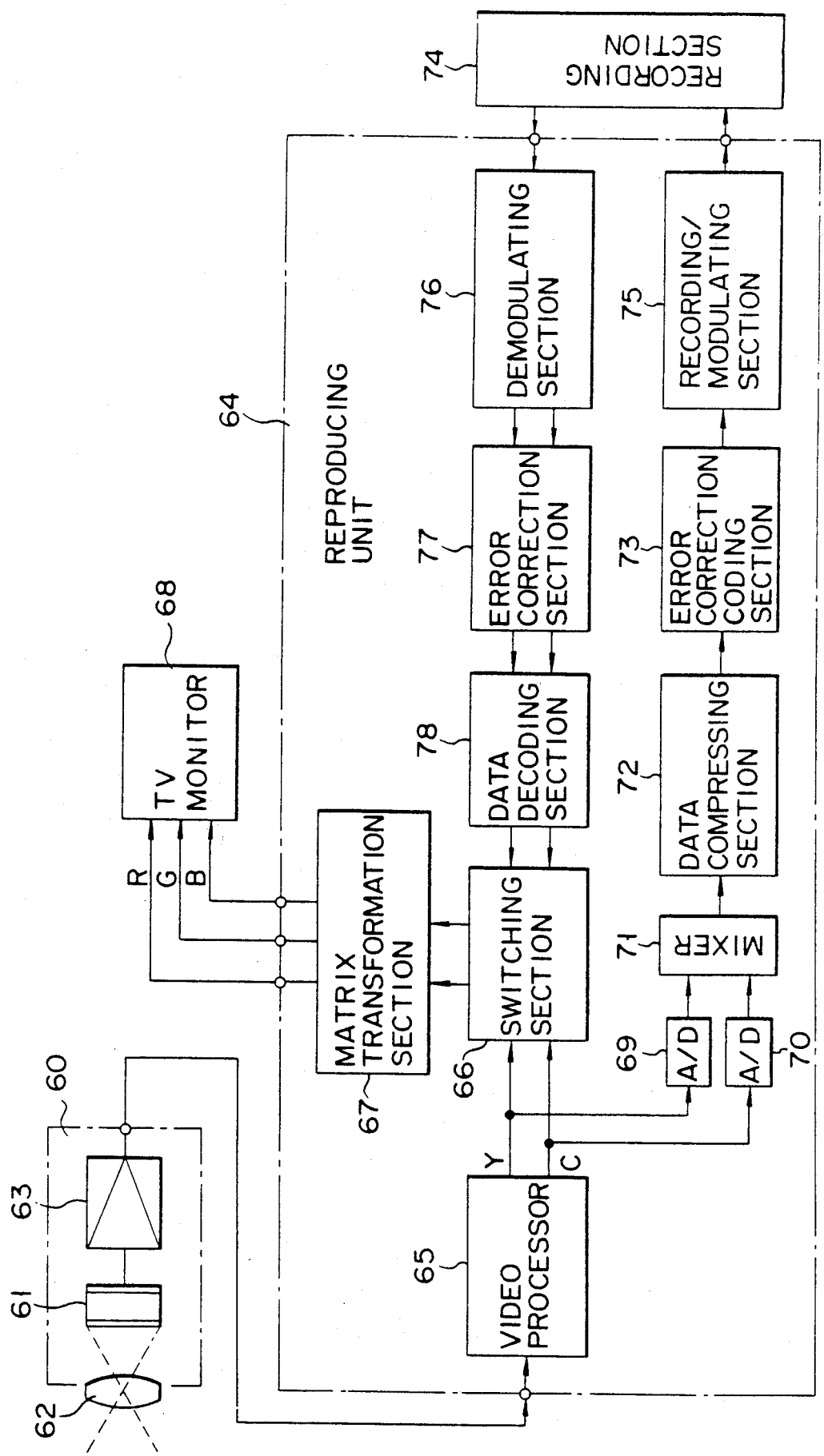
FIG. 7 is a block diagram showing an electronic still camera as the second embodiment of the present invention which is constituted by the image sensing and recording device of the first embodiment, and its overall system arrangement.

FIG. 7 shows a schematic arrangement of an electronic still camera main body constituted by the image sensing and recording device having the above-described element structure, and of an electronic still camera system formed for this electronic still camera.

Figure 8:
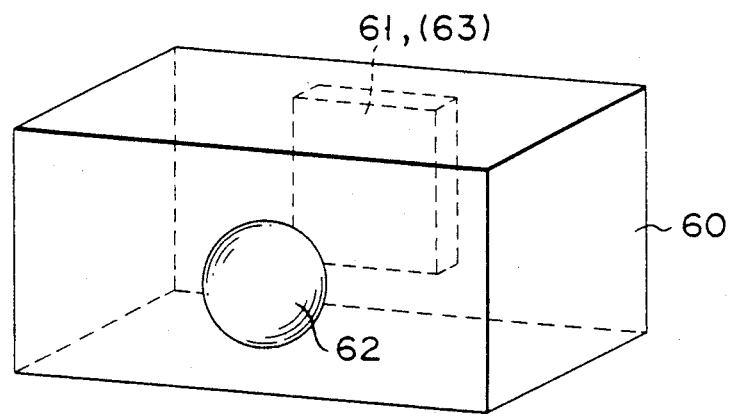
FIG. 8 is a view showing a schematic structure of a dark box member of the electronic still camera in FIG. 7.

As shown in FIG. 7, the electronic still camera main body basically comprises an image sensing and recording device 61 having the above-described element structure, an optical lens 62 for forming an object image on the image sensing surface of the image sensing and recording device 61, and an output amplifier 63 for amplifying a signal read out from the image sensing and recording device 61 to a predetermined level. These components are arranged in a predetermined dark box member 60, as shown in FIG. 8. More specifically, as indicated by a block diagram of FIG. 9A, the electronic still camera main body is constituted by the optical lens 62 and the image sensing and recording device 61 as main components, and also incorporates, e.g., a power source section 61a for driving the image sensing and recording device 61, a control section 61b, including the above-mentioned gate control circuit 39, for controlling an operation of the image sensing and recording device 61, and a release switch 61c for controlling an image sensing operation. Note that the output amplifier 63 may be integrally incorporated in the image sensing and recording device 61.

Figure 9A:
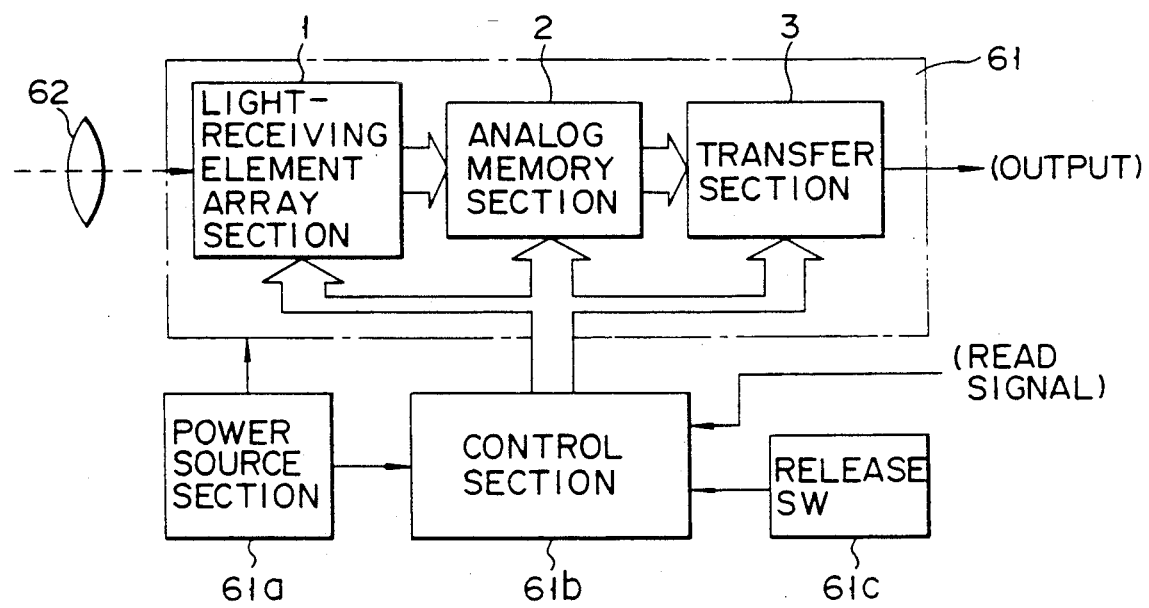
FIG. 9A is a block diagram showing a main portion of the electronic still camera in FIG. 7.
Figure 9B:
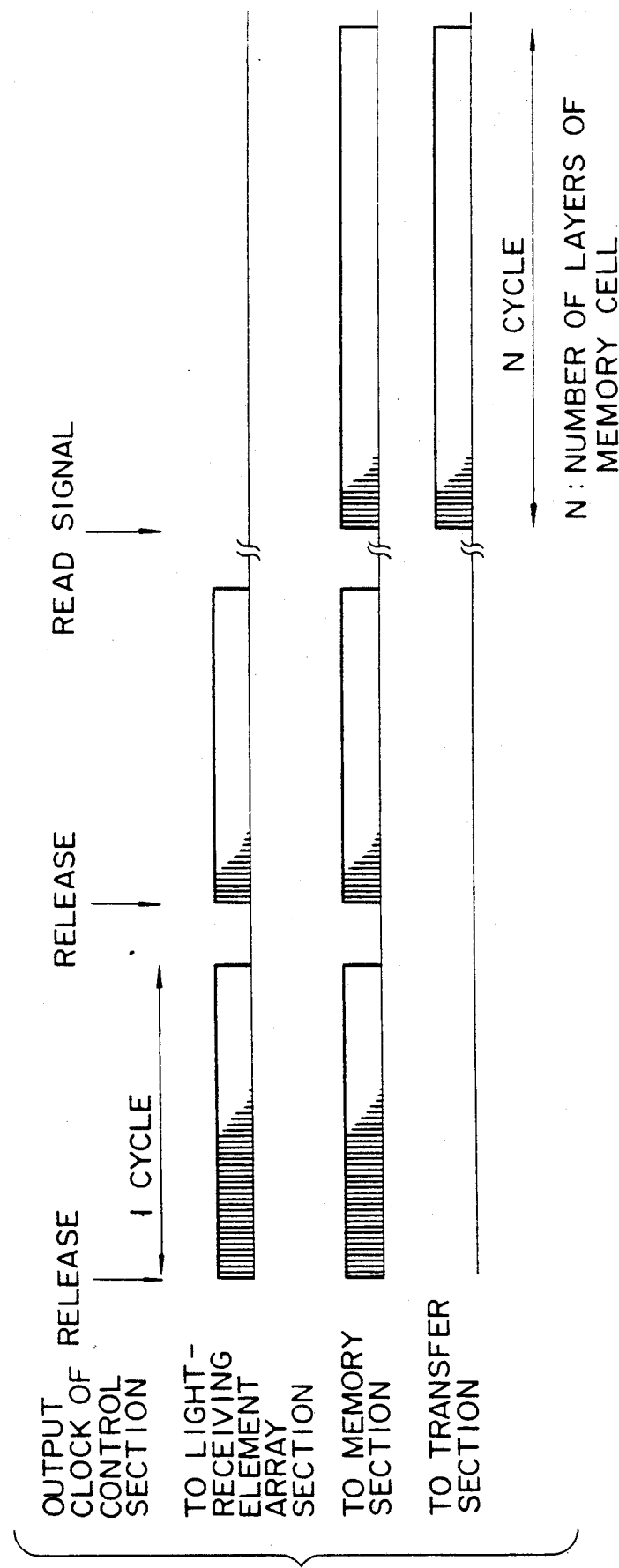
FIG. 9B is a timing chart for explaining the operation sequence of a control section shown in FIG. 9A.

FIG. 9B is a timing chart for explaining the operation sequence of the control section 61b shown in FIG. 9A.

In this electronic still camera main body, only the following operations are performed: electronic image sensing of an object image by means of the image sensing and recording device 61; and recording/retaining of the sensed electronic still image by means of the analog memory section 2. A read operation of the electronic still image from the electronic still camera upon starting of the transfer section 3 is performed only when a reproducing unit 64 is connected to the main body.

This reproducing unit 64 includes a video processor 65 for receiving image signals sequentially read out from the image sensing and recording device 61 of the electronic still camera main body through the transfer section 3, and performing predetermined image signal processing of the read image signals. The image signals which underwent the signal processing by means of the video processor 65 are output as predetermined video signals from a switching section 66 to a TV monitor 68 through a matrix transformation section 67 so as to be reproduced as images.

A/D converters 69 and 70 arranged in the reproducing unit 64 serve to convert the signals which underwent the predetermined signal processing in the video processor 65, e.g., luminance signal components and color difference signal components which underwent color separation processing, into digital signal components. A mixer 71 mixes the signal components obtained by such A/D conversion to supply them for signal processing for digital recording of image signals. The processing for recording the image signals includes data compression by a data compressing section 72, addition of error correction codes and coding process thereof by means of an error correction coding section 73, and signal modulation which is performed by a recording/modulating section 75 to record the image signals in a recording section 74 such as a floppy disk.

The electronic still image signals read out from the image sensing and recording device 61 of the electronic still camera are sequentially recorded in the recording section 7 through such image signal processing systems.

The reproducing unit 64 is designed to read out the electronic still image signals which are recorded in the recording section 74 in the above-described manner and to cause the TV monitor 68 to reproduce the signals as images.

More specifically, the electronic still image signals read out from the recording section 74 are fetched by the reproducing unit 64 upon demodulation processing through a demodulating section 76. An error correcting section 77 corrects the demodulated still image signals, i.e., corrects errors accompanying recording/reproducing operations of the image signals by using error correction codes in the above-described manner. The error-corrected signals are supplied to a data demodulating section 78. The signals are datademodulated by this data demodulating section 78. The signals demodulated into the original electronic still image signals are output from the switching section 66 to the TV monitor 68 through the matrix transformation section 67 and are reproduced as images.

With such a system, the arrangement of the electronic still camera main body can be greatly simplified by effectively assigning functions to the electronic still camera main body and the reproducing unit 64 side in such a manner that only the function of sensing an object image and recording/retaining it by using the image sensing and recording device 61 is provided in the electronic still camera main body while the signal processing function for the sensed/recorded electronic still images and the signal processing function for recording, retaining, reading, and reproducing of the images are provided on the reproducing unit 64 side. Therefore, a low-cost, highly operable electronic still camera main body can be realized.

In addition, since the reproducing unit 64 to which the above-mentioned functions are assigned is realized as a so-called installation type apparatus, no serious problems are posed even if a great improvement in performance is attempted.

According to such a system arrangement, for example, the electronic still camera is regarded as a so-called reusable camera using a normal film, and the reproducing unit 64 is regarded as a so-called processing laboratory, thus realizing an apparatus for performing predetermined signal processing of electronic still images sensed/recorded by the electronic still camera and storing the resultant data in a recording medium such as a floppy disk as a file.

More specifically, for example, the following system can be realized. A user of an electronic still camera main body of the same type as described above entrusts a processing laboratory with the electronic still camera main body upon image sensing and recording. In the processing laboratory, electronic still images recorded in the electronic still camera main body are reproduced, and predetermined image signal processing is performed. The processing laboratory then returns to the user a recording medium such as a floppy disk in which high-quality image signals are recorded. In this case, the analog memory section 2 of an electronic still camera main body from which all electronic still images are read out may be subjected to erase processing so that the electronic still camera main body can be returned to a user in a reusable (rephotographing) state.

In such a system, high-precision adjustment for, e.g., image distortion, chromatic aberration, blurring, and image contrast can be performed by using sophisticated image processing techniques on the processing laboratory (reproducing unit 64) side. Accordingly, for example, even if the optical lens 62 of the electronic still camera main body incorporated in the dark box member 60 is slightly distorted, image distortion caused by such distortion can be effectively corrected on the processing laboratory side. In addition, even if a slight amount of light leaks from the dark box member 60, a trouble caused by such leakage can be corrected on the processing laboratory side.

The optical lens 62 of the electronic still camera, therefore, can be constituted by an inexpensive plastic single element lens, and the dark box member 60 can be constituted by a simple paper box, thus realizing a simple, inexpensive arrangement. In addition, with such an arrangement of the electronic still camera main body, the power source section 61a can be constituted by a paper-like battery incorporated in the paper box. This also simplifies the arrangement of the electronic still camera and decreases its cost.

According to the above-described advantages of the electronic still camera main body, the electronic still camera main body can be realized as a collapsible structure, as shown in, e.g., FIG. 10A. More specifically, slits 82 and folding lines 83 for assembling the dark box member 60 are formed beforehand in and on a card member 81 having, e.g., about the size of a name card or a cash card and a predetermined thickness.

In addition, chuck members 84 are arranged on side portions (of the structure) which are to be matched with each other when the dark box member 60 is assembled by performing separation along the slits 82 and bending along the folding lines 83. The chuck members 84 serve to fasten the side portions to each other. As shown in FIG. 10B the dark box member 60 can be assembled by using the chuck members 84.

The above-described image sensing and recording device 61 is bonded, in advance, to a portion constituting a certain inner wall upon assembly of the dark box member 60 of the card member 81, and a hole is formed in a portion constituting a surface facing the device 61. A plastic lens 85 is inserted in the hole. In addition, a paper-like battery 86 and a pressure-sensitive release switch 87 are properly arranged on other portions. Furthermore, a finder hole serving as a predetermined eyehole may be formed to be parallel to a line connecting the image sensing and recording device 61 and the plastic lens 85 upon assembly of the dark box member 60.

If the necessary components of an electronic still camera are arranged on the card member 81 in this manner, and the card member 81 can be assembled in the dark box member 60 to allow image sensing of an object to be photographed as needed, since this card member 81 can always be carried with, e.g., a cash card, the operability can be greatly improved. Especially, since such a structure can be assembled in an electronic still camera only when it is required, its practical advantage can be greatly improved.

When an electronic still camera is to be realized as such a card member 81, electrical contacts are preferably arranged on the above-mentioned chuck members 84 so that the image sensing and recording device 61 is operated only when the card member 81 is assembled in the dark box member 60. In addition, even if the dark box member 60 is to be disassembled and carried upon image sensing, since the analog memory section 2 of the image sensing and recording device 61 is constituted by EEPROMs, recorded electronic still image signals are not lost. Moreover, the optical lens may be designed to be arbitrarily interchanged with a wide-angle lens or a telephoto lens. Various modifications can be made in such a manner.

The camera system shown in FIGS. 8, 10A and 10B can be embodied as follows. Its card-like base member 81 is made of, for example, a flexible material which is strong enough to withstand repeated folding, and such wiring as that of flexible substrates which are commonly used nowadays is employed. Structural elements may be connected beforehand with the wiring, or may be connected by the chuck members 84 when base member 81 is folded into a box, as is described above.

Note that the present invention is not limited to the above-described embodiment. For example, the structure of the image sensing and recording device can be variously modified as long as the above-described basic structure is maintained. For example, the number of the layers of the analog memory section may be determined in accordance with the specification device. In addition, the number of pixels of the image sensing device can be determined in accordance with the specifications. Furthermore, a high-speed storage operation for electronic still images may be used to record signals in a so-called continuous shooting mode by incorporating the image sensing and recording device of the present invention as an image sensing device in each of various types of conventional electronic still cameras. Moreover, when an electronic still camera is to be constituted as a disposable camera, a structure corresponding to the specifications of the camera can be employed as needed. Various changes and modifications can be made within the spirit and scope of the invention.

As has been described above, according to the present invention, an analog memory section constituted by a plurality of layers for parallelly transferring and storing electronic still images sensed by a light-receiving element array section is integrally formed between the light-receiving element array section and a transfer section of an image sensing device having a conventional, normal arrangement constituted by the light-receiving element array section and the transfer section, thereby providing an image sensing and recording device for recording/retaining a plurality of electronic still images as they are. Therefore, various practical effects can be obtained, e.g., a simpler arrangement of an electronic still camera and a reduction in cost thereof.

Additional embodiments of the present invention will be apparent to those skilled in the art from consideration of the specifications and practice of the present invention disclosed herein. It is intended that the specification and examples be considered as exemplary only, with the true scope of the present invention being indicated by the following claims.

What is claimed is:

1. An image sensing and recording device comprising:
   a light-receiving element array section, having an image sensing surface on which a plurality of light-receiving elements are two-dimensionally arranged, for generating signal charges by photoelectrically arranged, for generating signal charges by photoelectrically converting light images incident on said image sensing surface in units of said plurality of light-receiving elements;
   an analog memory section having a plurality of storage regions staked vertically in a multilayer structure on said light-receiving element array section, said plurality of storage regions including means for transferring the signal charges generated by said plurality of light-receiving element of said light-receiving element array section in a stacked direction thereof and sequentially storing the signal charges; and
   a transfer section, stacked to sandwich said analog memory section between said transfer section and said light-receiving element array section, for reading out the signal charges, which are sequentially stored in said analog memory section, as time-serial image signals.

2. A device according to claim 1, wherein said light-receiving element array section, said analog memory section, and said transfer section are realized as a semiconductor device having an element structure stacked and integrally formed on a predetermined semiconductor substrate.

3. A device according to claim 2, wherein said transfer section is formed as a charge transfer element group on said predetermined semiconductor substrate, said analog memory section is formed as a semiconductor memory cell group having a plurality of layers stacked on said charge transfer element group, and said light-receiving element array section is formed as a two-dimensionally arranged semiconductor light-receiving element group stacked on an uppermost layer portion of said semiconductor memory cell group having the plurality of layers.

4. A device according to claim 3, wherein said semiconductor memory cell group is constituted by a plurality of two-dimensional analog memories stacked as layers and having signal charge storage portions respectively corresponding to the elements of said semiconductor light-receiving element group.

5. A device according to claim 4, wherein said plurality of two-dimensional analog memories respectively include EEPROM cells.

6. A device according to claim 2, wherein said charge transfer element group includes CCD channels each constituted by an impurity layer of a second conductivity type formed on a semiconductor substrate of a first conductivity type, and a plurality of CCDs each constituted by a transfer gate electrode and a CCD electrode embedded in an insulating layer on each of said CCD channels.

7. A device according to claim 6, wherein each element of said semiconductor light-receiving element group includes a photodiode embedded between a layer of the second conductivity type and a layer of the first conductivity type, and a reset transistor constituted by said layer of the first conductivity type, said layer of the second conductivity type, and a gate electrode embedded in an insulating layer.

8. A device according to claim 5, wherein said EEPROM cells have a structure constituted by layers sequentially stacked on each other in a vertical direction, each of said layers including a control gate electrode having a floating gate formed therein, source and drain regions constituted by a layer of the second conductivity type embedded in a layer of the first conductivity type, and a load resistor, and said EEPROM cells being sequentially connected to each other through wiring interlayer electrodes in the vertical direction.

9. A device according to claim 4, wherein each of said two-dimensional analog memories includes a memory cell having an MNOS structure.

10. A device according to claim 1, wherein said analog memory section comprises a plurality of EEPROM cells as layers integrally stacked on said transfer section constituted by said charge transfer elements, and the signal charges from said light-receiving element array section integrally stacked on said analog memory section are parallelly transferred and stored in the direction of thickness in response to a control gate pulse supplied to each of said EEPROM cells.

11. A device according to claim 1, wherein said light-receiving element array section comprises a plurality of capacitors for respectively storing the signal charges generated by said plurality of light-receiving elements upon photoelectric conversion, said light-receiving element array section having an electronic shutter function realized by control of signal charge storage times of said capacitors.

12. An electronic still camera comprising:
   an image sensing and recording device comprising:
   a) a light-receiving element array section, having an image sensing surface on which a plurality of light-receiving elements are two-dimensionally arranged, for generating signal charges by photoelectrically converting light images incident on said image sensing surface in units of said plurality of light-receiving elements,
   b) an analog memory section having a plurality of storage regions stacked vertically in a multilayer structure on said light-receiving element array section, said plurality of storage regions including means for transferring the signal charges generated by said plurality of light-receiving elements of said light-receiving element array section in a stacked direction thereof and sequentially storing the signal charges, and
   c) a transfer section, stacked to sandwich said analog memory section between said transfer section and said light-receiving element array section, for reading out the signal charges, which are sequentially stored in said analog memory section, as time-serial image signals;
   a dark box member incorporating said image sensing and recording device;
   an optical lens arranged in said dark box member, for forming an object image on the image sensing surface of said image sensing and recording device; and
   control means, arranged in said dark box member, for controlling generation of signal charges by said light-receiving element array section of said image sensing and recording device and controlling transfer/storage of signal charges by said analog memory section.

13. A camera according to claim 12, wherein said image sensing and recording device, said optical lens for forming an object image on the image sensing surface of said image sensing and recording device, a power source section for supplying driving power to said image sensing and recording device, and a switching section for controlling image sensing and recording of an object image by said image sensing and recording device are arranged on a card-like base member which can be assembled into a box by bending.

14. A camera according to claim 13, wherein said card-like base member which can be assembled into the box, has a structure constituted by slit portions and folding portions molded in advance, said slit portions being able to be separated upon assembly to form a dark box having a predetermined shape so as to oppose said optical lens to a light-receiving surface of said image sensing and recording device, and said folding portions defining portions at which said slit portions are bent.

15. A camera according to claim 12, wherein said light-receiving element array section, said analog memory section, and said transfer section are realized as a semiconductor device having an element structure stacked and integrally formed on a predetermined semiconductor substrate.

16. A camera according to claim 15, wherein said transfer section is formed as a charge transfer element group on said predetermined semiconductor substrate, said analog memory section is formed as a semiconductor memory cell group having a plurality of layers stacked on said charge transfer element group, and said light-receiving element array section is formed as a two-dimensionally arranged semiconductor light-receiving element group stacked on an uppermost layer portion of said semiconductor memory cell group having the plurality of layers.

17. A camera according to claim 16, wherein said semiconductor memory cell group is constituted by a plurality of two-dimensional analog memories stacked as layers and having signal charge storage portions respectively corresponding to the elements of said semiconductor light-receiving element group.

18. A camera according to claim 17, wherein said plurality of two-dimensional analog memories respectively include EEPROM cells.

19. A camera according to claim 15, wherein said charge transfer element group includes CCD channels each constituted by an impurity layer of a second conductivity type formed on a semiconductor substrate of a first conductivity type, and a plurality of CCDs each constituted by a transfer gate electrode and a CCD electrode embedded in an insulating layer on each of said CCD channels.

20. A camera according to claim 19, wherein each element of said semiconductor light-receiving element group includes a photodiode embedded between a layer of the second conductivity type and a layer of the first conductivity type, and a reset transistor constituted by said layer of the first conductivity type, said layer of the second conductivity type, and a gate electrode embedded in an insulating layer.

21. A camera according to claim 18, wherein said EEPROM cells have a structure constituted by layers sequentially stacked on each other in a vertical direction, each of said layers including a control gate electrode having a floating gate formed therein, source and drain regions constituted by a layer of the second conductivity type embedded in a layer of the first conductivity type, and a load resistor, and said EEPROM cells being sequentially connected to each other through wiring interlayer electrodes in the vertical direction.

22. A camera according to claim 17, wherein each of said two-dimensional analog memories includes a memory cell having an MNOS structure.

23. A camera according to claim 12, wherein said analog memory section comprises a plurality of EEPROM cells as layers integrally stacked on said transfer section constituted by said charge transfer elements, and the signal charges from said light-receiving element array section integrally stacked on said analog memory section are parallelly transferred and stored in the direction of thickness in response to a control gate pulse supplied to each of said EEPROM cells.

24. A camera according to claim 12, wherein said light-receiving element array section comprises a plurality of capacitors for respectively storing the signal charges generated by said plurality of light-receiving elements upon photoelectric conversion, said light-receiving element array section having an electronic shutter function realized by control of signal charge storage times of said capacitors.

* * * * *